(12) United States Patent
Ying et al.

(10) Patent No.: US 9,040,386 B2
(45) Date of Patent: May 26, 2015

(54) METHOD FOR VARIED TOPOGRAPHIC MEMS CAP PROCESS

(71) Applicant: Maxim Integrated Products, Inc., San Jose, CA (US)

(72) Inventors: Xuejun Ying, San Jose, CA (US); Li Li, Fremont, CA (US); Amit S. Kelkar, Flower Mound, TX (US); Brian S. Poarch, Frisco, TX (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 14/141,615

(22) Filed: Dec. 27, 2013

(65) Prior Publication Data

US 2015/0028455 A1 Jan. 29, 2015

Related U.S. Application Data

(60) Provisional application No. 61/857,323, filed on Jul. 23, 2013, provisional application No. 61/866,574, filed on Aug. 16, 2013.

(51) Int. Cl.
*B81C 1/00* (2006.01)
*B81B 7/00* (2006.01)

(52) U.S. Cl.
CPC ........... *B81C 1/00626* (2013.01); *B81B 7/0009* (2013.01)

(58) Field of Classification Search
CPC .......................... B81C 1/00626; B81B 7/0009
USPC .................................................. 438/456, 455
See application file for complete search history.

(56) References Cited

U.S. PATENT DOCUMENTS 6,861,363 B2 * 3/2005 Harchanko et al. ........... 438/706
2007/0072321 A1 * 3/2007 Sherrer et al. .................. 438/26

* cited by examiner

*Primary Examiner* — Roy Potter
*Assistant Examiner* — Paul Patton
(74) *Attorney, Agent, or Firm* — Advent, LLP

(57) ABSTRACT

A device includes sidewalls formed in a wafer surface, where the sidewalls descend to a recessed surface. The recessed surface generally promotes resist coverage on the wafer surface, including corners (e.g., junctions between the wafer surface and various surface topographies, such as cavities, the recessed surface, and so forth) on the wafer. In one or more implementations, a wet etching procedure is used to form the sidewalls and recessed surface. A resist material (e.g., a photoresist material) is deposited onto the wafer surface, where the photoresist fully covers one or more of the top corners of the wafer surface. In one or more implementations, the recessed surface is positioned adjacent a trench formed in the wafer to promote resist coverage on the top surface of the wafer.

18 Claims, 2 Drawing Sheets

METHOD FOR VARIED TOPOGRAPHIC MEMS CAP PROCESS

CROSS-REFERENCE TO RELATED APPLICATIONS

The present application claims the benefit under 35 U.S.C. §119(e) of U.S. Provisional Application Ser. No. 61/857,323, entitled METHOD FOR EXTREME TOPOGRAPHIC MEMS CAP PROCESS, filed Jul. 23, 2013, and U.S. Provisional Application Ser. No. 61/866,574, entitled METHOD FOR EXTREME TOPOGRAPHIC MEMS CAP PROCESS, filed Aug. 16, 2013. U.S. Provisional Application Ser. Nos. 61/857,323 and 61/866,574 are hereby incorporated by reference in their entirety.

BACKGROUND

Consumer electronic devices, in particular, mobile electronic devices such as smart phones, tablet computers, and so forth, increasingly employ smaller, more compact components to furnish their users with desired features. Such devices often employ microelectromechanical systems (MEMS), the technology of very small devices. MEMS devices are made up of small components and are often fabricated using modified semiconductor device fabrication technologies, normally used to make electronics, and can be incorporated as three dimensional integrated circuit devices (3D IC). Three-dimensional integrated circuit devices are semiconductor devices that employ two or more layers of active electronic components. Through-substrate vias (TSV) interconnect electronic components on the different layers (e.g., different substrates) of the device allowing the devices to be integrated vertically as well as horizontally. Consequently, MEMS devices provide electrical functionality within a small, compact footprint.

SUMMARY

Devices (e.g., MEMS devices), and processes for forming the devices, are disclosed, wherein the devices have sidewalls formed in a wafer surface, where the sidewalls descend to a recessed surface. The recessed surface generally promotes resist coverage on the wafer surface, including corners (e.g., junctions between the wafer surface and various surface topographies, such as cavities, the sidewalls, the recessed surface, and so forth) on the wafer. In one or more implementations, a wet etching procedure is used to form the sidewalls and recessed surface. A resist material (e.g., a photoresist material) is deposited onto the wafer surface, where the photoresist fully covers one or more of the top corners of the wafer surface. In one or more implementations, the recessed surface is positioned adjacent a trench formed in the wafer to promote resist coverage on the top surface of the wafer.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The Detailed Description is described with reference to the accompanying figures. The use of the same reference numbers in different instances in the description and the figures may indicate similar or identical items.

DETAILED DESCRIPTION

Overview

Microelectromechanical systems (MEMS) devices are often utilized to provide integrated circuit functionality within a small, compact footprint. Such MEMS devices can include varying topography, such as cavities, trenches, and so forth, in order to support various components (e.g., dies, wafers, etc.). Where components of the MEMS devices are susceptible to environmental conditions, it can be desirable to hermetically seal the MEMS device, such as with a MEMS cap process. The topography of the MEMS device can affect the quality of the seal, such as by having portions of the wafer exposed to the environment, even after a photoresist is deposited onto the wafer surface. The exposure can occur at corners (e.g., junctions between the wafer surface and various surface topographies, such as cavities) on the wafer, where the resist material may not fully cover. For instance, the coverage of a portion of a wafer can be affected by surface tension, gravity, and other factors that can cause resist material to recede from portions of the wafer, such as at corners, leaving those portions exposed. Exposed portions (e.g., corners) of a wafer generally have a detrimental impact on MEMS device quality, such as by preventing a hermetic seal, and can negatively impact yield of suitable MEMS devices.

Accordingly, techniques are described to fabricate MEMS devices having sidewalls formed in a wafer surface, where the sidewalls descend to a recessed surface. The recessed surface generally promotes resist coverage on the wafer surface, including corners (e.g., junctions between the wafer surface and various surface topographies, such as cavities, the recessed surface, and so forth) on the wafer. In one or more implementations, a wet etching procedure is used to form the sidewalls and recessed surface. A resist material (e.g., a photoresist material) is deposited onto the wafer surface, where the photoresist fully covers one or more of the top corners of the wafer surface. In one or more implementations, the recessed surface is positioned adjacent a trench formed in the wafer to promote resist coverage on the top surface of the wafer.

Example Implementations

Figure 1:
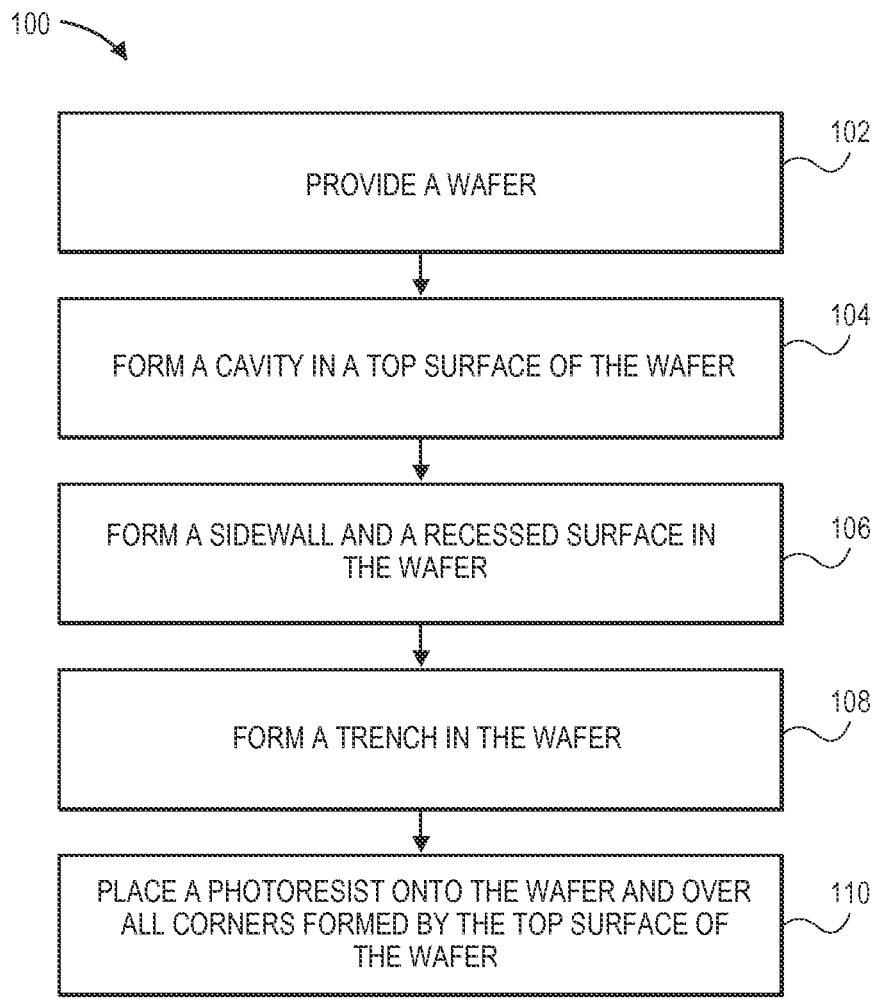
FIG. 1 is a flow chart diagram illustrating a process for producing a device (e.g., MEMS device) in accordance with an exemplary embodiment of the present disclosure.
Figure 2:
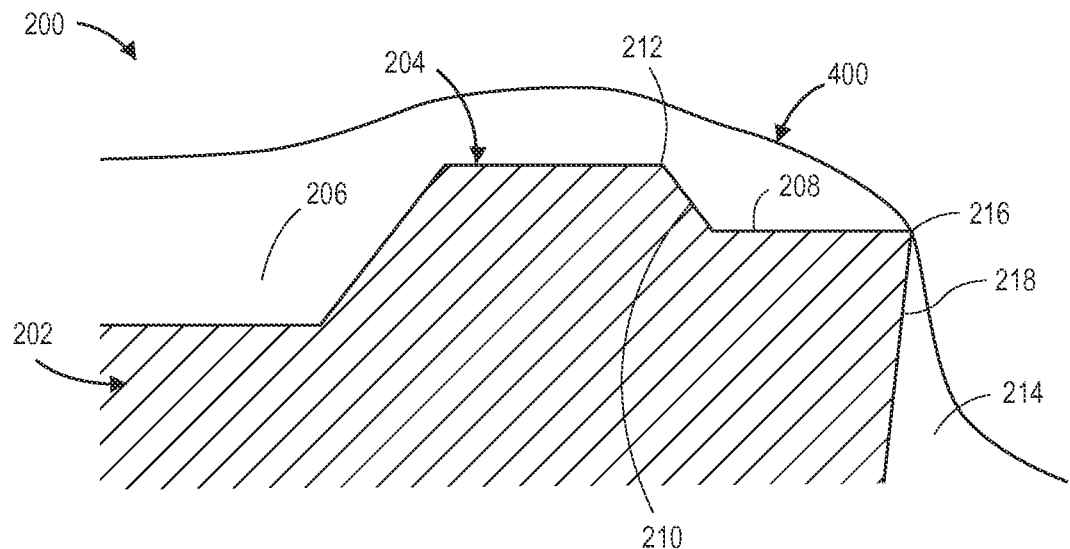
FIG. 2 is a diagram illustrating a device (e.g., a MEMS device), in accordance with an exemplary embodiment of the present disclosure.
Figure 3:
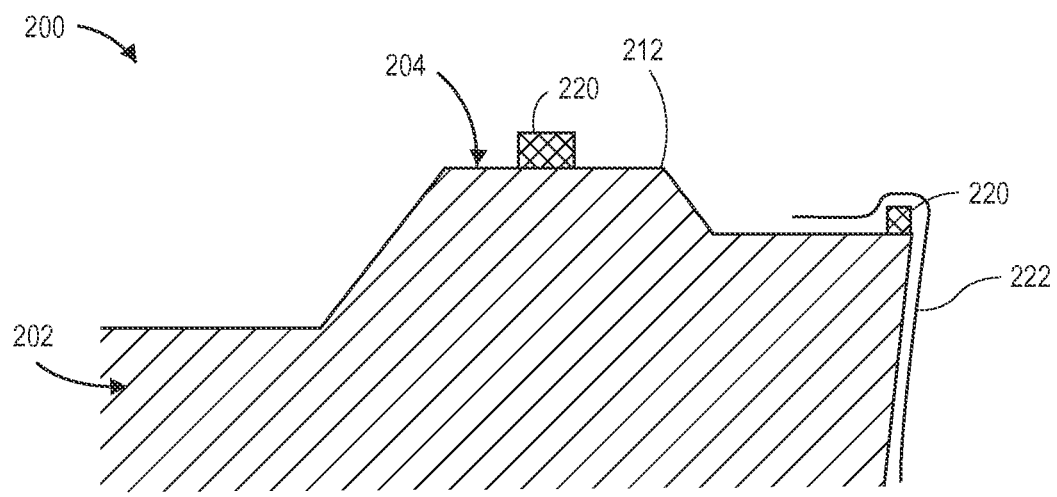
FIG. 3 is a diagram illustrating a device (e.g., a MEMS device), in accordance with a further exemplary embodiment of the present disclosure.

Referring generally to FIGS. 1-3, a device (FIGS. 2 and 3) and a process (FIG. 1) for producing the device are disclosed. In implementations, the device 200 is a microelectromechanical systems (MEMS) device (e.g., a MEMS cap). In implementations, the process 100 includes providing a wafer (Block 102). For example, the device 200 comprises a wafer (e.g., a MEMS cap wafer) 202, such as a silicon wafer. In implementations, the wafer 202 includes a surface 204, such as a top or upper surface.

In implementations, the process 100 (e.g., a MEMS process, a wafer process, a three-dimensional (3-D) integrated circuit process, a MEMS cap process, and so forth) may include forming a cavity in a surface of the wafer (Block 104).

In implementations, one or more cavities 206 may be formed in the top surface 204 of the wafer 202. The cavities 206 may be sized according to design specifications, which may vary depending on the article to be inserted into the cavity. For example, in an implementation, the cavity 206 is approximately thirty micrometers (30 um) deep (e.g., may measure 30 um from the top surface 204 to a base of the cavity 206).

In implementations, the process 100 may include forming a sidewall and a recessed surface in the wafer (Block 106). In implementations, a recessed surface 208 (e.g., recessed with respect to the top surface 204), such as a recess step or recessed step, may be formed in the wafer 202. In implementations, as shown in FIG. 2, the top surface 204 of the wafer 202 transitions to the recess step 208 via a sidewall 210 formed in the wafer 202. In implementations, the sidewall 210 is a sloped sidewall. For example, the slope angle of the sidewall 210 may be range from about 20 degrees to about 90 degrees. In a particular implementation, the slope angle of the sidewall 210 is from about 54 degrees to about 55 degrees, and in particular may be 54.74 degrees from the surface of the recess step 208. In other embodiments, the sidewall 210 is non-sloped (e.g., forms a 90 degree angle). In implementations, the top surface 204 of the wafer 202 forms one or more corners (e.g., top corners) 212 at a junction of the top surface 204 and the sidewall 210. In implementations, the sidewall 210 is formed via an etching process, such as an anisotropic silicon wet etching process. In implementations, the recessed surface (e.g., recessed step) 208 is formed during a same step (e.g., substantially simultaneously with the formation of, co-formed with, and so forth) as the formation of other wafer topology features (e.g., cavities, recesses, trenches, and the like), thereby conserving (e.g., not introducing additional/subsequent) process steps for formed the recessed surface 208. Such a process may promote efficiency of throughput of the devices 100.

In implementations, the process 100 may include forming a trench in the wafer (Block 108). In implementations, a trench 214 (e.g., a deep trench), may be formed in the wafer 202. The trench 214 may be sized according to design specifications. For example, the trench 214 may be three-hundred micrometers deep, which in implementations, accounts for approximately half of the wafer thickness. In implementations, one or more corners (e.g., a sacrificial corner, deep trench corner) 216 is/are formed at a junction of the recess step 208 and a trench sidewall 218 (e.g., the junction being the deep trench corner, corner 216).

In implementations, the process 100 may include placing a photoresist onto the wafer and over a corner formed by the surface (e.g., top surface 204) of the wafer (Block 110). In implementations, a photoresist 400 is placed onto/over the top surface 204 of the wafer 202, such that the photoresist 400 covers (e.g., completely covers) the corners (e.g. all of the top corners 212) formed by the top surface 204. In implementations, the photoresist 400 is a light-sensitive material suitable for use in industrial processes, such as photolithography, for forming a patterned coating on a surface. In implementations, the sacrificial corner 216 and sloped transition (e.g., sloped sidewall) 210 from the top surface 204 to the recessed surface 208 promote resist coverage on the top surface 204. In some implementations, the sacrificial corner 216 remains exposed (e.g., not covered by photoresist) after application of the photoresist 400 to the wafer 202, however the corners 212 on the top surface 204 are covered completely by the photoresist 400. In implementations, the top surface 204 (including sacrificial corner 216) is completely covered by the photoresist 400.

In implementations, as shown in FIG. 3, a metal 220, such as gold, may be formed (e.g., plated) on at least a portion of the top surface (e.g., bonding surface) 204 of the wafer 202. In implementations, the metal 220 may be formed on the top surface 204 of the wafer 202 as a thin (e.g., ranging from a few nanometers to 100 micrometers thick) film. In implementations, the metal (e.g., gold) 220 may be formed on the top surface 204 of the wafer 202 via a deposition process, such as a physical deposition process or a chemical deposition process. However, the metal (e.g., gold) 220 is not formed on the top corners 212. In implementations, the metal (e.g., gold) 220 may also be formed on the sacrificial corner(s) 216. In implementations, such as shown in FIG. 3, getter 222 may also be formed (e.g., deposited) on the wafer 202. For example, the getter 222 is deposited on the sacrificial corner(s) 216 along with the metal 220, such that the getter 222 is deposited onto/over the metal 220 at the sacrificial corner(s) 216. In implementations, the deposition of the metal 220 and the getter 222 are controlled such that the overall combined height (e.g., thickness) of the getter 222 and the metal 220 deposited on the sacrificial corner(s) 216 is below the top surface (e.g., bonding surface) 204, such as shown in FIG. 3. In implementations, the metal 220 and getter 222 deposited onto the wafer 202 are implemented as part of a gold plating and getter liftoff process.

The process 100 and device 200 described herein allow for/promote consistent photoresist coverage on wafers (e.g., MEMS cap wafers) having extreme topographic structures (e.g., deep trenches and deep cavities). For example, the process 100 and device 200 described herein allow for/promote consistent photoresist coverage on the top surface 204 (e.g., over all of the top corners 212) of the wafer 202. In implementations, the recess step 208 of the device 200 promotes/facilitates consistent photoresist coverage on the top surface 204 (e.g., over all of the top corners 212) of the wafer 202. By promoting such quick, consistent coverage over all of the top corners 212 of the top surface 204 of the wafer 202, the process 100 and device 200 describe herein do not suffer from the problems associated with exposed top corners. Exposed top corners generally have a detrimental impact on MEMS device quality (e.g., by preventing a hermetic seal) and yield. Further, the above-referenced characteristics of the device 200 allow for the process 100 to be a cost-effective and high throughput process. Still further, because the device 200 and process 100 described herein allow for such consistent coverage, a relatively thin photoresist may be used in the process 100 described herein compared with processes that require more substantial photoresist materials. Further, in implementations, undesired deposition at the sacrificial corner(s) 216 of the wafer 202 can have reduced or negligible impact on the wafer level bonding process due to the formation of the recess step 208, which may allow for a build-up of resist material along sidewall 210 and onto the top surface 204.

In embodiments, the device (e.g., MEMS device) 200 may include a central unit that processes data (e.g., processor, microprocessor), and several components that interact with the surroundings (e.g., sensors, microsensors). The device 200 may be fabricated using modified semiconductor device fabrication technologies, normally used to make electronics. Such technologies may include: molding and plating, wet etching (e.g., via exposure to potassium hydroxide, tetramethyammonium hydroxide, and so forth), dry etching (e.g., reactive-ion etching, deep reactive-ion etching), electro discharge machining and other technologies capable of manufacturing small devices. Basic techniques may include: deposition of material layers, patterning by photolithography, and etching to produce required shapes.

In implementations, the device 200 may be implemented in electronic devices, such as smartphones, automotive devices, and so forth. In implementations, the device 200 may be/may include sensor(s), such as motion sensor(s), and so forth.

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A device comprising:
a semiconductor wafer having a top surface and having a sidewall and a recessed surface formed in the top surface, the sidewall extending from the top surface to the recessed surface in the wafer;
a trench formed in the semiconductor wafer, the trench positioned proximal to the recessed surface; and
a photoresist material deposited onto the top surface of the semiconductor wafer, the photoresist material covering a top corner of the semiconductor wafer, the top corner comprising a junction between the top surface and the sidewall, the photoresist material extending from the top surface along the sidewall to the recessed surface, wherein the recessed surface preserves coverage of the top corner by supporting a portion of the photoresist material that extends along the sidewall to the top corner.

2. The device as recited in claim 1, further comprising a cavity formed in the top surface of the semiconductor wafer.

3. The device as recited in claim 1, further comprising one or more corners formed by the top surface of the semiconductor wafer proximal to the recessed surface.

4. The device as recited in claim 1, wherein the top surface is a bonding surface.

5. The device as recited in claim 1, wherein the semiconductor wafer is a microelectromechanical systems (MEMS) wafer.

6. The device as recited in claim 5, wherein the semiconductor wafer is a microelectromechanical systems cap (MEMS cap) wafer.

7. The device as recited in claim 1, wherein the sidewall has an angle of inclination from the recessed surface of from about 20 degrees to about 90 degrees.

8. The device as recited in claim 1, wherein the angle of inclination from the recessed surface of the sidewall is from about 54 degrees to about 55 degrees.

9. The device as recited in claim 1, further comprising a metal deposited on the top surface, where a top corner of the semiconductor wafer is free of the metal, the top corner comprising a junction between the top surface and the sidewall.

10. The device as recited in claim 9, wherein the metal is further located on the recessed surface, the metal on the recessed surface at least partially covered by a getter material.

11. The device as recited in claim 10, wherein a combined height of the metal and the getter material from the recessed surface is less than a height of the top surface from the recessed surface.

12. A process comprising:
providing a wafer;
forming a trench in the wafer;
forming a sidewall and a recessed surface in the wafer, the sidewall extending from a top surface of the wafer to the recessed surface in the wafer, the recessed surface proximal to the trench; and
depositing a photoresist material onto the wafer and over a top corner of the semiconductor wafer, the top corner comprising a junction between the top surface and the sidewall, the deposited photoresist material extending from the top surface along the sidewall to the recessed surface, wherein the recessed surface preserves coverage of the top corner by supporting a portion of the photoresist material that extends along the sidewall to the top corner.

13. The process as recited in claim 12, further comprising: forming a cavity in a surface of the wafer.

14. The process as recited in claim 12, wherein forming the sidewall includes forming the sidewall with an angle of inclination from the recessed surface of from about 20 degrees to about 90 degrees.

15. The process as recited in claim 14, wherein the angle of inclination from the recessed surface of the sidewall is from about 54 degrees to about 55 degrees.

16. The process as recited in claim 12, further comprising:
depositing a metal on the top surface, with a top corner of the semiconductor wafer being free of the deposited metal, the top corner comprising a junction between the top surface and the sidewall.

17. The process as recited in claim 16, further comprising:
depositing the metal on the recessed surface; and
at least partially covering the metal on the recessed surface with a getter material.

18. A microelectromechanical (MEMS) device comprising:
at least one of a processor or a sensor; and
a device operably coupled to the at least one of the processor or the sensor, the device comprising:
a semiconductor wafer having a top surface and having a sidewall and a recessed surface formed in the top surface, the sidewall extending from the top surface to the recessed surface in the wafer, the sidewall having an angle of inclination from the recessed surface of from about 20 degrees to about 90 degrees;
a trench formed in the semiconductor wafer, the trench positioned proximal to recessed surface; and
a metal deposited on the top surface of the semiconductor wafer, where a top corner of the semiconductor wafer is free of the metal, the top corner comprising a junction between the top surface and the sidewall.

* * * * *